(12) United States Patent
Kanyandekwe et al.

(10) Patent No.: US 12,721,068 B2
(45) Date of Patent: Aug. 25, 2026

(54) METHOD FOR PRODUCING A MICROELECTRONIC DEVICE

(71) Applicant: COMMISSARIAT A L'ENERGIE ATOMIQUE ET AUX ENERGIES ALTERNATIVES, Paris (FR)

(72) Inventors: Joël Kanyandekwe, Grenoble Cedex 09 (FR); Cyrille Le Royer, Grenoble Cedex 09 (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 872 days.

(21) Appl. No.: 17/656,274

(22) Filed: Mar. 24, 2022

(65) Prior Publication Data

US 2022/0310394 A1 Sep. 29, 2022

(30) Foreign Application Priority Data

Mar. 26, 2021 (FR) ..................................... 21 03113

(51) Int. Cl.
*H10P 30/22* (2026.01)
*H10D 12/01* (2025.01)
(Continued)

(52) U.S. Cl.
CPC ........... *H10P 30/22* (2026.01); *H10D 12/031* (2025.01); *H10D 62/151* (2025.01); *H10D 62/8325* (2025.01)

(58) Field of Classification Search
CPC .................................................. H01L 21/4763
See application file for complete search history.

(56) References Cited

U.S. PATENT DOCUMENTS 7,582,547 B2 * 9/2009 Pawlak ............. H01L 21/26506 438/479
7,678,637 B2 3/2010 Nandakumar et al.
(Continued)

FOREIGN PATENT DOCUMENTS

EP 1 884 985 A1 2/2008
WO WO 2009/017997 A1 2/2009

OTHER PUBLICATIONS

French Preliminary Search Report issued Nov. 25, 2021 in French Application 21 03113 filed on Mar. 26, 2021, 9 pages (with English Translation of Categories of Cited Documents & Written Opinion).
(Continued)

*Primary Examiner* — Jeff W Natalini
*Assistant Examiner* — Nicholas Leland Hutson
(74) *Attorney, Agent, or Firm* — Oblon, McClelland, Maier & Neustadt, L.L.P.

(57) ABSTRACT

A method for forming crystalline SiC-based regions on either side of an N-type transistor channel, including: providing a substrate including a silicon-based layer having a thickness e, forming at least one masking pattern on the silicon-based layer, with the at least one masking pattern having openings, with the openings corresponding to implantation regions of the silicon-based layer, amorphising the silicon-based layer through the openings of the at least one masking pattern, in the implantation regions, to a depth d strictly less than the thickness e, so as to form amorphised implantation regions in the silicon-based layer, implanting carbon into amorphous implantation regions, performing thermal recrystallisation annealing to turn the amorphised implantation regions into crystalline SiC-based regions, the method including: after forming the crystalline SiC-based regions, forming a transistor gate on the silicon-based layer, directly at the edge of the crystalline SiC-based regions.

18 Claims, 5 Drawing Sheets

(51) Int. Cl.
*H10D 62/13* (2025.01)
*H10D 62/832* (2025.01)

(56) References Cited

U.S. PATENT DOCUMENTS

| | | | | |
|---|---|---|---|---|
| 8,524,592 | B1 * | 9/2013 | Xie | H10D 62/021 257/387 |
| 2007/0252205 | A1 * | 11/2007 | Hoentschel | H01L 29/66772 438/528 |
| 2008/0057683 | A1 * | 3/2008 | Pawlak | H10D 30/60 257/E29.107 |
| 2009/0026552 | A1 * | 1/2009 | Zhang | H01L 29/0847 257/E21.409 |
| 2009/0035911 | A1 | 2/2009 | Rachmady et al. | |
| 2010/0279479 | A1 | 11/2010 | Hatem et al. | |
| 2011/0068403 | A1 * | 3/2011 | Hattendorf | H01L 21/26506 257/347 |
| 2012/0068193 | A1 | 3/2012 | Chan et al. | |
| 2013/0161649 | A1 | 6/2013 | Chan et al. | |
| 2015/0364570 | A1 * | 12/2015 | van Meer | H01L 29/6659 438/305 |
| 2018/0254343 | A1 * | 9/2018 | Schippel | H01L 29/45 |

OTHER PUBLICATIONS

Liu et al., "Strained Si Channel MOSFETs with Embedded Silicon Carbon Formed by Solid Phase Epitaxy", 2007 IEEE. Symposium on VLSI Technology, IEEE, 2007, pp. 44-45.

* cited by examiner

METHOD FOR PRODUCING A MICROELECTRONIC DEVICE

TECHNICAL FIELD

This invention relates to the microelectronic field. It can be used to produce n-type transistors with a mechanically stressed channel.

STATE OF THE ART

In CMOS technology, i.e. based on complementary metal-oxide-semiconductor transistors, the performance of n-type transistors can be improved by the use of channels that are tensile stressed, in particular based on thin-film substrates on a fully depleted insulator, made of fully depleted silicon on an insulator (FDSOI), for example.

Tensile stressed channels can be produced locally by forming SiC-based regions on both sides of the silicon channels. These regions are also known as "stressors".

The document entitled "Strained Si Channel MOSFETs with Embedded Silicon Carbon Formed by Solid Phase Epitaxy, Yaocheng Lui et al, Symposium on VLSI Technology Digest of Technical Papers, 2007" discloses a solution for forming SiC-based regions in the source and drain regions of an nFET ("n-type Field Effect Transistor"). This solution involves implanting carbon in the source and drain regions on either side of the transistor's gate and spacers, followed by solid-phase epitaxy (SPE) of the SiC. This induces a tensile stress in the channel, of about 615 MPa.

A disadvantage of this solution is that the tensile stress is not sufficient to significantly increase the performance of nFET transistors. The document cited above suggests combining the forming of SiC in the source and drain regions described above with a stress layer forming step typically known as a "stress liner".

The interest in using SiC-based stressor forming is therefore limited.

There is therefore a need to overcome the limitations of known solutions.

In particular, one of the aims of this invention is to provide a method for producing SiC-based regions that increase the tensile stress in the channel.

Abstract

In order to achieve this aim, according to one embodiment, a method is provided for forming crystalline SiC-based regions on either side of an N-type transistor channel, including:

- Providing a substrate comprising a silicon-based layer having a thickness e,
- Forming at least one masking pattern, with the at least one masking pattern having openings, with the said openings corresponding to implantation regions of the silicon-based layer,
- Amorphising the silicon-based layer through the openings of the at least one masking pattern, in the implantation regions, to a depth d strictly less than the thickness e, so as to form amorphised implantation regions in the silicon-based layer,
- Implanting carbon in the amorphised implantation regions, preferably to an implantation depth equal to the amorphisation depth d or less,
- Performing thermal recrystallisation annealing to turn the amorphised implantation regions into crystalline SiC-based regions, Advantageously, after forming the crystalline SiC-based regions, the method involves forming a transistor gate on the silicon-based layer directly at the edge of the crystalline SiC-based regions.

As mentioned above, the crystalline SiC-based regions form "stressors" inducing a state of tensile stress, typically in x and y according to the orthonormal reference framework attached to the figures, in the surrounding silicon. This state of tensile stress decreases with increasing distance away from the stressor.

It is thus intended to make maximum advantage of the stress state induced by these stressors, by forming the transistor gate directly at the edge of the said stressors. The maximum tensile stress state obtained is thus directly below the gate. The transistor's silicon channel, which is by definition located under the said gate, thus benefits fully from this maximum tensile stress state generated by the stressors.

Unlike the stressor formation disclosed above, the stressors in this case are as close to the channel as possible, and typically extend under the spacers on either side of the gate.

Furthermore, in the method according to the invention, the transistor gate is advantageously formed after the forming of the crystalline SiC-based regions. This avoids subjecting the transistor gate to the thermal recrystallisation annealing required for the transformation of the amorphised implantation regions into crystalline SiC-based regions. The transistor gate is thus preserved from potential damage due to this type of annealing. In contrast to the approach cited above in the document entitled "Strained Si Channel MOSFETs with Embedded Silicon Carbon Formed by Solid Phase Epitaxy, Yaocheng Lui et al, Symposium on VLSI Technology Digest of Technical Papers, 2007", the transistor gate is in this case protected.

The method therefore enables the forming of higher performance nFET transistors with tensile stressed channels.

As an advantageous possibility, the method also includes the forming of raised sources and drains on the stressors, on either side of the gate spacers. These raised sources and drains further increase the tensile stress state initially generated by the stressors in the silicon. The silicon channel is thus further tensile stressed by the cumulative contributions of the stressors and the raised source and drains.

BRIEF DESCRIPTION OF THE FIGURES

The purposes, aims and features and benefits of the invention will become clearer from the detailed description of one embodiment thereof which is shown by the following accompanying drawings in which.

Figure 1A:
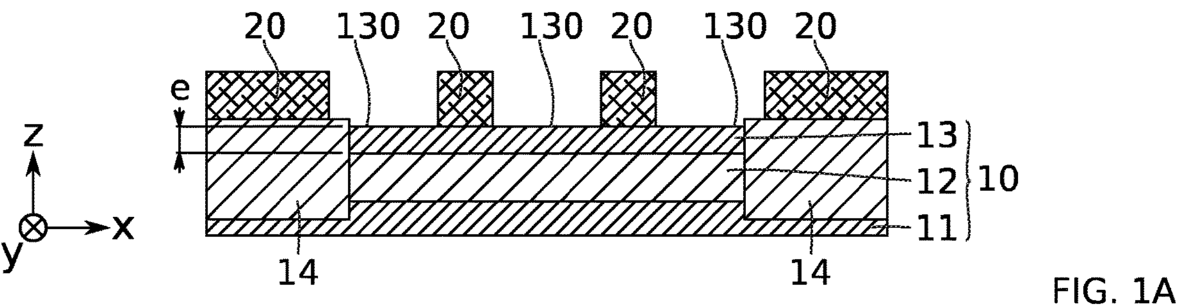
FIGS. 1A through 1C schematically illustrate the steps in a method for forming crystalline SiC-based regions according to one embodiment of this invention.

The drawings are given as examples and do not place any limit on the invention. They are schematic diagram representations intended to facilitate understanding of the invention and are not necessarily on the scale of practical applications. In particular, in the schematic diagrams, the thicknesses of the layers and the dimensions of the patterns and reliefs are not representative of reality.

DETAILED DESCRIPTION

Before beginning a detailed review of embodiments of the invention, optional features are set forth below which may optionally be used in combination or alternatively:

According to one example, the method also includes the forming of spacers on either side of the transistor gate, at least partly in crystalline SiC-based regions. The transistor's channel, located at the level of the gate, is closest to the stressors.

According to one example, the method also includes the forming through epitaxy of raised source and drain regions in crystalline SiC-based regions. Raised source and drain regions, also known as RSDs ("Raised Source Drain"), reduce the transistor access resistances. In the context of the invention, an additional effect related to the formation of RSDs was discovered. RSDs allow the tensile stress in the channel to be increased, in a synergistic way with the stressors. In particular, RSDs exert a stress along z, which appears to be at least partially transmitted back into the channel via the stressors along x.

According to one example, the at least one masking pattern is based on a bilayer of silicon nitride and silicon oxide. This effectively protects the silicon in the area of the masking patterns for forming transistor channels during amorphisation and/or implantation.

According to one example, the at least one masking pattern is removed before the forming of the transistor gate. This allows a gate to be produced in a standard way, typically according to a "gate first" method where the functional gate is produced before the spacers and preferably before the source and drain regions.

According to one example, the at least one masking pattern is retained to form a sacrificial gate. This allows a gate to be produced according to so-called "gate last" method where the functional gate is produced after the spacers and preferably after the source and drain regions. Such a method typically uses a sacrificial gate.

According to one example, the method also includes the forming of spacers on either side of the sacrificial gate, at least partly in crystalline SiC-based regions. The spacers do not cover the transistor channel. They are directly on the stressors.

According to one example, the method also includes, after forming the spacers, the removal of the sacrificial gate followed by the forming of the transistor gate. This allows a self-aligned functional gate to be produced between the stressors. The definition of the gates is optimised. The channels delimited by the gates are in direct contact with the stressors.

According to one example, the method also includes a step involving the forming of insulation trenches prior to forming the at least one masking pattern.

According to one example, the at least one masking pattern is based on a bilayer of polycrystalline silicon and silicon oxide.

According to one example, amorphisation takes place by implantation of heavy ions such as germanium.

According to one example, the thickness e of the silicon-based layer and the depth of amorphisation d are such that $e-d \geq 2$ nm. This leaves a thin crystalline layer of silicon under the amorphous layer. This thin crystalline layer, also known as the "seed", allows the initiation of recrystallisation during the subsequent recrystallisation annealing.

According to one example, carbon is implanted to an implantation depth equal to the amorphisation depth d or less.

According to one example, recrystallisation thermal annealing is carried out at a temperature of 1100° C. or more.

Unless otherwise specifically indicated, technical features described in detail for a given embodiment may be combined with technical features described in the context of other embodiments, for instance. In particular, the various structures (spacers, insulation trenches, encapsulation layer) illustrated in the figures can be combined to form another embodiment that is not necessarily illustrated or described. Such an embodiment is obviously not excluded from the invention.

It is stipulated that, in the context of this invention, the terms "over", "overcomes", "overlies", "underlying", "opposite" and their equivalents do not necessarily mean "in contact with". Thus, for example, the deposition of a first layer on a second layer does not necessarily mean that the two layers are directly in contact with each other, but rather that the first layer at least partially covers the second layer by being either directly in contact with it, or by being separated from it by at least one other layer or at least one other element.

A layer can also include several sublayers of the same or different materials.

A substrate, film or layer, "based on" a material A or "A-based" is understood to mean a substrate, film or layer comprising such a material A only or this material A and possibly other materials, such as alloying elements and/or doping elements. A silicon-based layer can thus mean an Si layer, a doped Si layer or a SiGe alloy layer.

Several embodiments of the invention involving successive steps of the manufacturing method are described below. Unless explicitly stated, the adjective "successive", while generally preferred, does not necessarily imply that the steps follow on from each other immediately, since they may be separated by intermediate steps.

Furthermore, the term "step" refers to the performing of a part of the method, and may refer to a set of sub-steps.

Furthermore, the term "step" does not necessarily mean that the actions carried out during a step are simultaneous or immediately successive. In particular, some actions in a first step may be followed by actions related to a different step, and other actions in the first step may be repeated afterwards. The term step thus does not necessarily mean unitary and inseparable actions in time and in the sequence of the method phases.

A preferably orthonormal reference framework, comprising the x, y, z axes, is shown in the attached figures. When only one reference is shown in a given sheet of figures, this reference applies to all the figures in this sheet.

In this patent application, the thickness of a layer is taken along a direction normal to the main extension plane of the layer. A layer thus typically has a thickness along z. The relative terms "on", "over", "under" and "underlying" refer to positions taken in the z direction.

The terms "vertical" and "vertically" refer to a direction along z. The terms "horizontal" and "horizontally" refer to a direction in the xy plane. The terms "lateral" and "laterally" refer to a direction in the yz plane.

An element located "perpendicular to" or "in line with" another element means that both elements are located along the same line perpendicular to a plane in which a bottom or top surface of a substrate primarily extends, i.e., along the same line oriented vertically in the figures.

The terms "substantially", "about", "of the order of" mean "to within 10%" or, when referring to angular direction, "to within 10°" and preferably "to within 5°". Thus, a direction substantially normal to a plane means a direction making an angle of $90\pm10^0$ to the plane.

A first example of the embodiment of the method is illustrated in FIGS. 1A through 1H. In this example, the forming of stressors is associated with the forming of transistor gates in a so-called "gate first" method, where the gate stack is retained after the forming of spacers.

As illustrated in FIG. 1A, masking patterns 20 are first formed on a substrate 10.

The substrate 10 is preferably of the Silicon On Insulator (SOI) type. Such a SOI substrate 10 comprises, according to the terminology common to the person skilled in the art, a so-called "Si bulk" layer 11 of thick silicon, a so-called "BOX" (Buried Oxide) layer 12 of silicon oxide and a so-called "top Si" layer 13 of thin silicon. The thickness e of the Si top 13 can typically be in the range from 10 nm to 30 nm, for example 12 nm. The thickness of the BOX layer 12 can typically be between 20 nm and 250 nm. Alternatively, the substrate 10 may be an "Si bulk" thick substrate.

The masking patterns 20 preferably have a height h in the range from 30 nm to 80 nm. Such a height h effectively protects the underlying silicon of the Si top layer 13 during subsequent amorphisation and/or implantation steps.

The masking patterns 20 are preferably formed by successive depositions of a silicon nitride-based layer (SiN) and a silicon oxide-based layer (SiO2), these depositions being typically followed by lithography and etching of the SiN and SiO2 layers.

According to one example, a 5 nm to 10 nm thick SiO2 layer is formed, for example, by thermal oxidation or by Chemical Vapour Deposition (CVD), on the Si top 13. A 10 nm to 20 nm thick SiN layer is then formed by Low Pressure Chemical Vapor Deposition (LPCVD) on the SiO2 layer.

In a known manner, a photosensitive resin is then deposited on the SiN layer, and then structured by lithography so as to define resin patterns over the future masking patterns 20. The SiN layer is first etched and the SiO2 layer is then etched on the exposed regions between the resin patterns. These first and second etching operations are preferably anisotropic and mainly directed along z. The first etching process can use a dry method, such as plasma based on NF3/NH3 chemistry, for example. The second etching process can use a wet method, based on a dilute hydrofluoric acid (HF) solution, or a hydrofluoric acid and hydrochloric acid (HF+HCl) solution, for example. The latter solution typically eliminates metal particle contamination. Alternatively, the second etching process can use a dry method, such as plasma based on HBr/O2 chemistry, for example.

After the second etching operation, the surface 130 of the Si top 13 is exposed between the masking patterns 20. The resin patterns can then be removed, by oxygen plasma O2, for example.

In one embodiment, the masking patterns 20 each comprise N layers (N=1 . . . 3) stacked along z. The etching of these N layers is then adjusted accordingly.

Figure 1B:
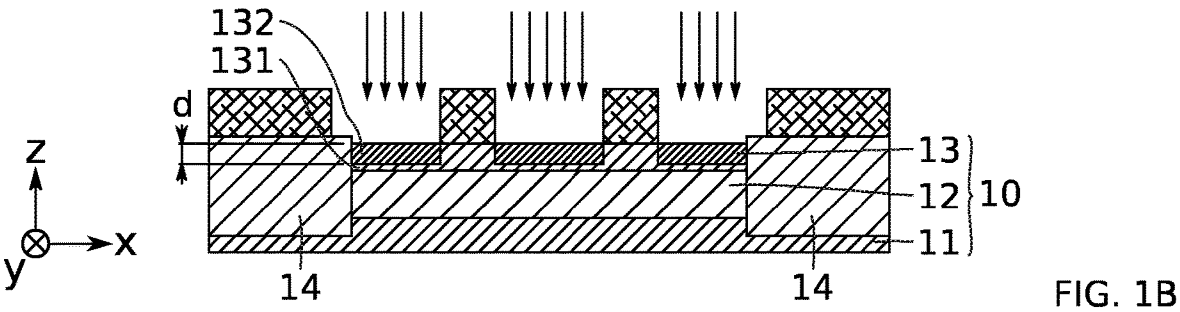

As shown in FIG. 1B, after forming the masking patterns 20, partial amorphisation of the Si top 13 is achieved from the exposed surface 130. This amorphisation can typically be carried out by implantation along z of heavy ions, such as germanium ions $Ge^{++}$, over a depth d. The amorphisation depth d is adopted to be strictly less than the thickness e of the Si top 13, so as to leave a seed 131 of crystalline silicon below the amorphised region 132. The seed 131 thus preferably has a thickness of 2 nm or more after amorphisation ($e-d\geq2$ nm). The heavy ion implantation settings, such as energy, dose, and angle of inclination with respect to z, can be determined by Monte-Carlo methods, typically via the well-known SRIM ("Stopping and Range of Ions in Matter") and/or TRIM ("Transport of Ions in Matter") type simulations. A non-zero angle of inclination with respect to z of about 5° or 10°, for example, can thus be chosen to compensate for a lack of verticality of the side walls of the masking patterns 20.

Figure 1C:
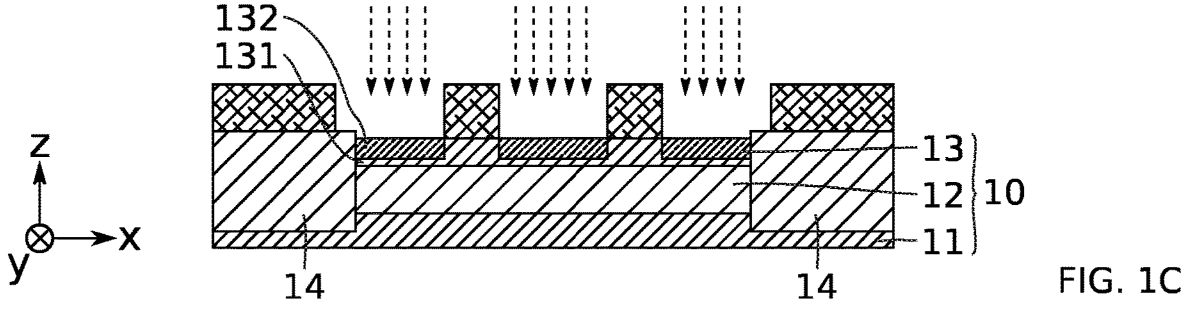

As shown in FIG. 1C, carbon C is implanted in the amorphised regions 132*a* of the Si 13 top from the exposed surface 130. The carbon ion implantation settings, such as energy, dose, and angle of inclination with respect to z, can be determined by Monte-Carlo methods, typically via SRIM and/or TRIM type simulations. The carbon implantation dose is typically between $1^e15$ $cm^{-2}$ and $1^e20$ $cm^{-2}$.

After carbon ion implantation, the amorphised regions 132*a* are amorphous SiC based.

Figure 1D:
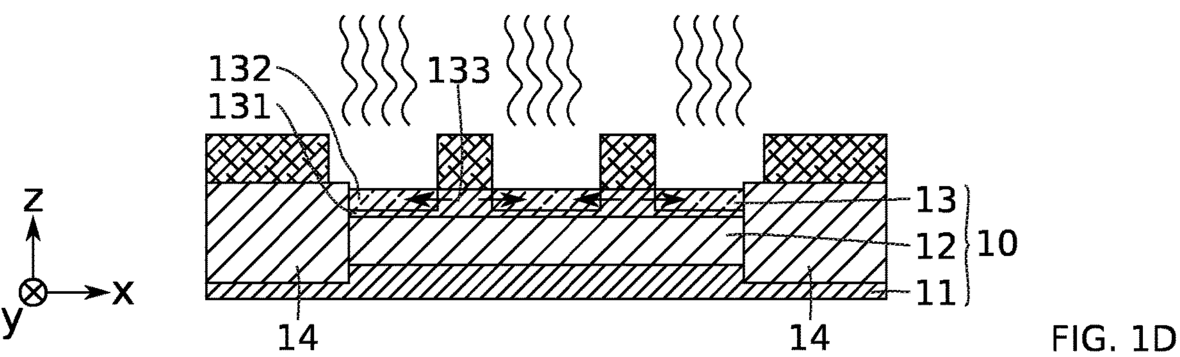
FIGS. 1D through 1H schematically illustrate the steps in a method for forming crystalline SiC-based regions according to one embodiment of this invention.

As shown in FIG. 1D, thermal annealing is then carried out to crystallise the amorphous SiC. The amorphous SiC is typically crystallised by a solid-phase epitaxy mechanism, based on seed 131.

The thermal annealing can be of the rapid annealing type, such as Rapid Thermal Processing (RTP), for example. It is preferably carried out at a temperature of 1100° C. or more.

After annealing, the regions 132*b* are crystalline SiC based. In the vicinity of the regions 132*b*, also referred to as stressors 132*b*, the silicon-based regions 133 are tensile stressed, typically to a uniaxial stress state along x, if the masking patterns are parallel rectangles with sides oriented along x and y.

Figure 1E:
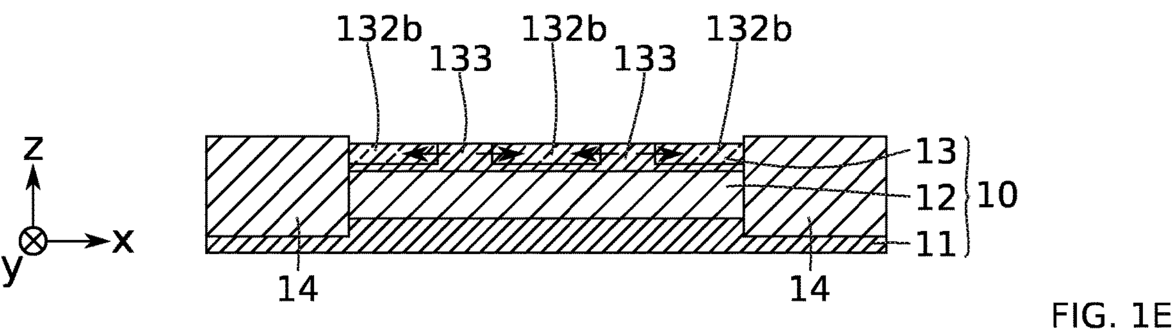

As shown in FIG. 1E, the masking patterns 20 are then removed, typically by wet etching with H3PO4 and HF. The Si top 13 then includes stressors 132*b* and tensile stressed regions 133, exposed at the surface 130. The tensile stressed regions 133 are intended to form the nFET transistor channels.

Figure 1F:
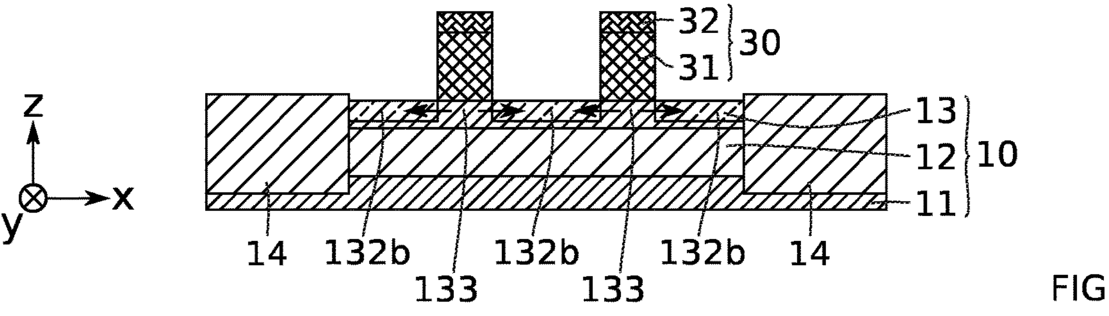
Figure 1G:
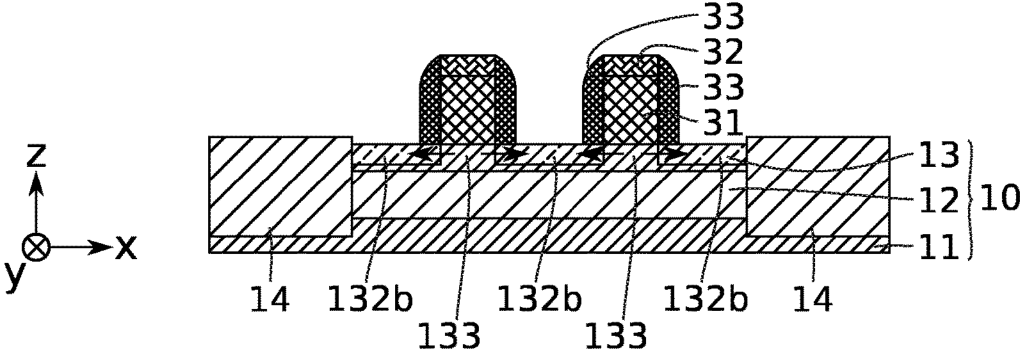
Figure 1H:
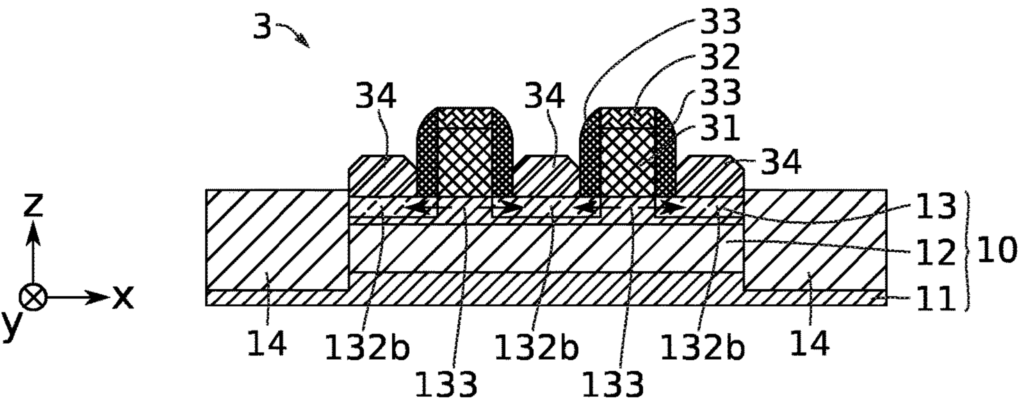

FIGS. 1F, 1G, 1H illustrate typical steps in manufacturing these transistors. In particular, the gate stacks 30 are formed in a standard way by deposition, lithography and etching. Typically, the gate stacks 30 include along to z, starting from the surface 130, a gate oxide (not shown), a gate 31, based on polycrystalline silicon, for example, and a hard mask 32 (FIG. 1F). The hard masks 32 are in this case aligned so as to be perpendicular to the tensile stressed regions 133. The gates 31 are also perpendicular to the tensile stressed regions 133. The tensile stressed regions 133 become the channels of the transistors 3. The channels 133 are thus as close as possible to the stressors 132*b*.

In one embodiment, the gate stacks 30 are typically insulated from each other by Shallow Trench Insulators (STIs) 14. This insulation is preferably performed after the stressors 132*b* are formed and before the gate stacks 30 are formed. The edge of the masking pattern 20 need not be aligned with the edge of the underlying STI 14.

Spacers 33 are typically formed on either side of the gate stacks 30, on the edges of the gates 31 (FIG. 1G). The spacers 33 are thus formed on the stressors 132*b*.

The source and drain regions 34 can then be formed on either side of the spacers 33. As an advantageous possibility shown in FIG. 1H, the source and drain regions 34 are epitaxially formed on the stressors 132*b* so as to be raised from the surface 130. The raised source and drain regions 34 can typically be doped silicon based. Other materials can also be used to form these raised source and drain regions 34. Such raised source and drain regions 34 advantageously induce additional tensile stress within the channels 133. This increases the total stress in channels 133.

A second example of the embodiment of the method is illustrated in FIGS. 2A through 2E.

In this example, the method is embodied after forming the Shallow Trench Insulator (STI) insulator trenches 14 and the sacrificial gates. The forming of stressors is in this case associated with the forming of transistor gates in accordance with a so-called "gate last" method. In this "gate last" method, the transistor gate is formed after the spacers are formed, instead of a pattern also known as a sacrificial gate. The sacrificial gate is preferably replaced by a "functional" gate after forming the Source-Drain and contact silicides.

Figure 2A:
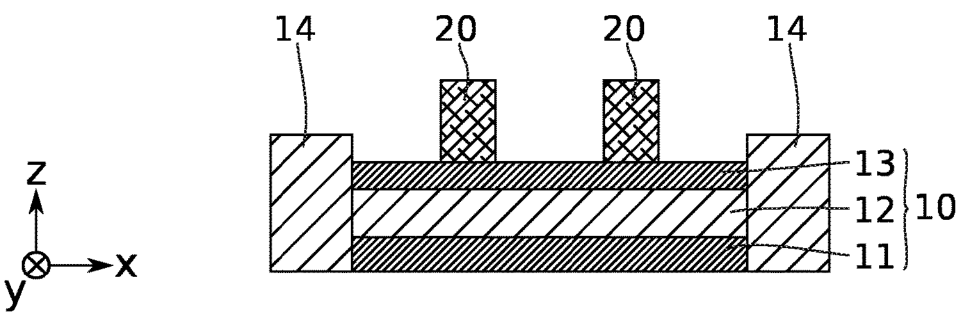
FIGS. 2A through 2E schematically illustrate the steps in a method for forming crystalline SiC-based regions according to another embodiment of this invention.
Figure 2B:
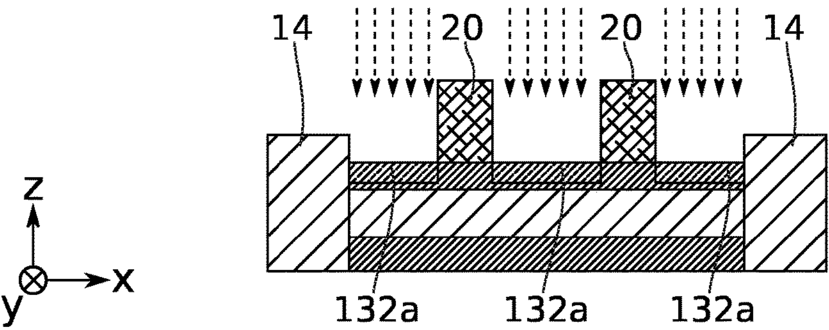

As before, masking patterns 20 are formed on the substrate 10 (FIG. 2A). These masking patterns 20 are intended to form sacrificial gates in the subsequent method. They can be based on silicon nitride and silicon oxide layers, as before. Alternatively, they can be based on polycrystalline silicon and silicon oxide layers.

In this case, the height h of the masking patterns 20 preferably ranges from 40 nm to 100 nm, so as to effectively protect the underlying silicon of the Si top 13 during subsequent amorphisation and/or implantation steps, and so as to meet the dimensional requirements in height of a sacrificial gate.

Amorphous SiC-based regions 132*a* are then formed in the Si top 13 between the masking patterns 20 as before, by amorphisation followed by carbon implantation or by heavy ion and carbon co-implantation (FIG. 28).

Figure 2C:
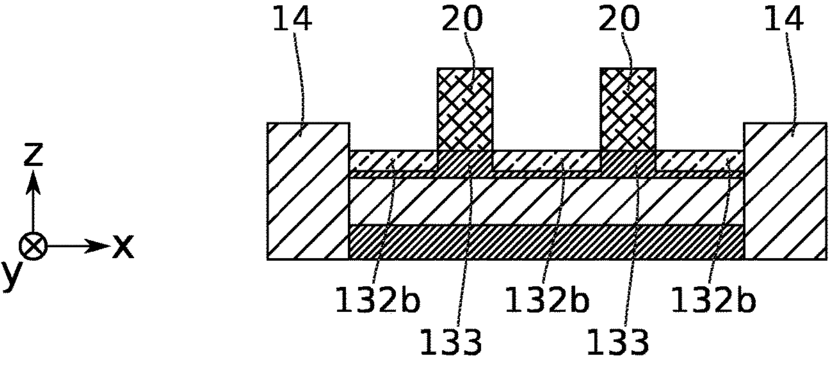

Thermal recrystallisation annealing is then performed as before so as to transform the amorphous SiC-based regions 132*a* into crystalline SiC-based regions 132*b*, the latter forming the stressors 132*b* (FIG. 2C).

In this embodiment, the masking patterns 20 are retained to form sacrificial gates. These sacrificial gates are thus self-aligned with the tensile stressed regions 133. The step involving the aligning the gates with the tensile stressed regions is thus advantageously avoided. Alignment is facilitated.

Figure 2D:
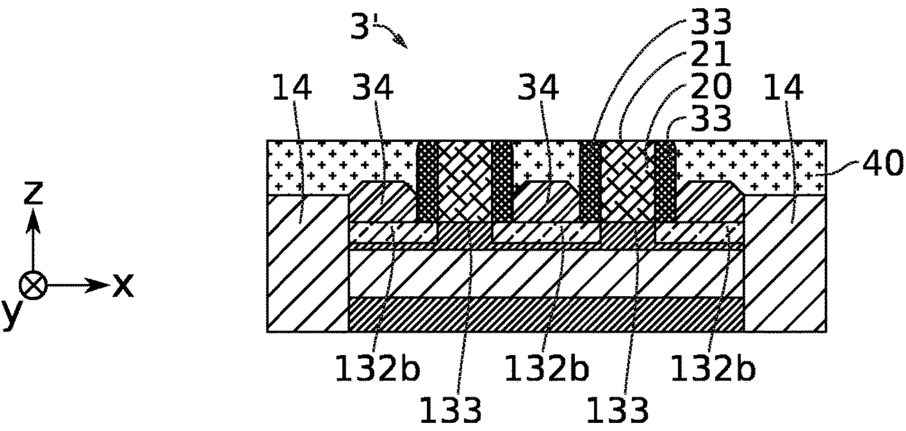

As shown in FIG. 2D, the spacers 33 are formed on either side of the sacrificial gates 20, on the stressors 132*b*. The source and drain regions 34 are then formed on either side of the spacers 33, on the stressors 132*b*. An encapsulation layer 40 can be deposited and then planarised to encapsulate the devices 3' by exposing a top surface 21 of the sacrificial gates 20.

Figure 2E:
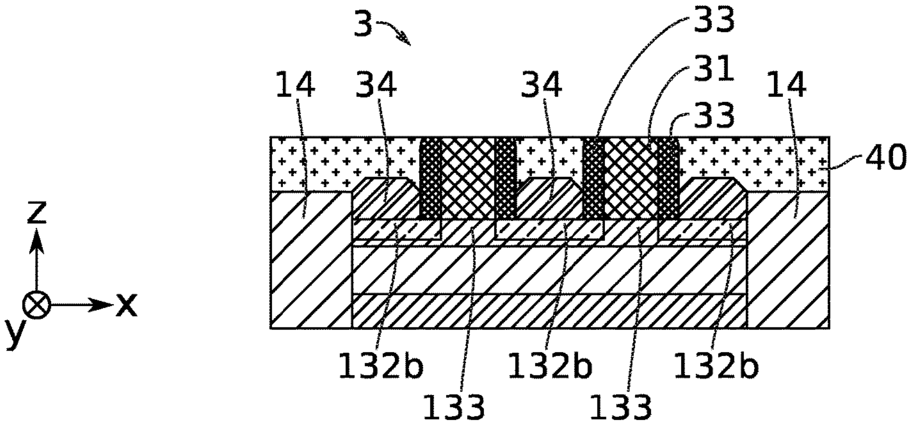

As shown in FIG. 2E, the sacrificial gates 20 can then be removed and replaced with functional gates 31. These functional gates 31 preferably include metal portions, based on tungsten and titanium nitride W/TiN, for example. They are typically separated from the tensile-stressed channels 133 by a material with a high dielectric constant, referred to high k. nFET transistors 3 are thus formed.

The known steps involved in siliconizing the source and drain regions and forming the electrical contacts are not described here and can be performed conventionally.

In particular, this "gate last" embodiment allows the formation of gates directly aligned with the tensile stressed channels, without alignment difficulties.

From the above description, it is clear that the proposed method offers a particularly efficient solution for producing SiC-based stressors as close as possible to the channels of nFET transistors.

The invention is not limited to the previously described embodiments and extends to all embodiments covered by the claims.

The invention claimed is:

1. A method for forming crystalline SiC-based regions on either side of an N-type transistor channel, comprising:

providing a substrate comprising a crystalline silicon-based layer having a thickness e, forming at least one masking pattern on a surface of the crystalline silicon-based layer, with the at least one masking pattern having openings, with said openings corresponding to implantation regions of the crystalline silicon-based layer, amorphising the crystalline silicon-based layer through the openings of the at least one masking pattern, in the implantation regions, to a depth d strictly less than the thickness e, so as to form amorphised implantation regions in the crystalline silicon-based layer, implanting carbon into the amorphised implantation regions using the at least one masking pattern, and performing thermal recrystallisation annealing to turn the amorphised implantation regions into crystalline SiC-based regions, wherein:

after forming the crystalline SiC-based regions, forming a conductive transistor gate material on the silicon-based layer, vertical edges of the conductive transistor gate material being aligned with vertical edges of the crystalline SiC-based regions.

2. The method according to claim 1, comprising the forming of spacers on either side of the transistor gate, at least partly in crystalline SiC-based regions.

3. The method according to claim 2, wherein the vertical edges of the conductive transistor gate material are aligned with vertical edges of the crystalline SiC-based regions such that the transistor gate material is disposed directly on a tensile stressed region without being disposed directly on any portion of the crystalline SiC-based regions, and the spacers are disposed directly on the crystalline SiC-based regions without being disposed directly on any portion of the tensile stressed region.

4. The method according to claim 1, wherein the at least one masking pattern is based on a bilayer of silicon nitride and silicon oxide.

5. The method according to claim 1, wherein the at least one masking pattern is removed before the forming of the transistor gate.

6. The method according to claim 1, wherein the at least one masking pattern is retained to form a sacrificial gate.

7. The method according to claim 6, further comprising a formation of spacers on either side of the sacrificial gate, at least partly in crystalline SiC-based regions.

8. The method according to claim 7, further comprising, after forming the spacers, removal of the sacrificial gate followed by the forming of the transistor gate.

9. The method according to claim 6, further comprising a step involving the forming of insulation trenches prior to the forming of the at least one masking pattern.

10. The method according to claim 6, wherein the at least one masking pattern is based on a bilayer of polycrystalline silicon and silicon oxide.

11. The method according to claim 1, wherein the thickness e of the silicon-based layer and the amorphisation depth d are such that e-d≥2 nm.

12. The method according to claim 11, wherein the amorphisation depth d is 20 nm or less.

13. The method according to claim 1, wherein the carbon is implanted to an implantation depth equal to the amorphisation depth d or less.

14. The method according to claim 1, wherein the amorphisation takes place by implantation of heavy ions.

15. The method according to claim 1, wherein the substrate is of the silicon-on-insulator (SOI) type and comprises an oxide layer buried beneath the crystalline silicon-based layer of thickness e.

16. The method according to claim 1, comprising:

forming the carbon-implanted amorphised implantation regions in the crystalline silicon-based layer such that a portion of the crystalline silicon-based layer is in physical contact with the carbon-implanted amorphised implantation regions; and performing the thermal recrystallisation annealing to turn the carbon-implanted amorphised implantation regions into the crystalline SiC-based regions using the portion of the crystalline silicon-based layer as a seed layer.

17. The method according to claim 1, wherein amorphising the crystalline silicon-based layer through the openings of the at least one masking pattern comprises maintaining a portion of the crystalline silicon-based layer at the surface directly under the at least one masking region and between adjacent ones of the amorphised implantation regions in crystalline form.

18. A method for forming crystalline SiC-based regions on either side of an N-type transistor channel, comprising:

providing a substrate comprising a crystalline silicon-based layer having a thickness e, forming at least one masking pattern on a surface of the crystalline silicon-based layer, with the at least one masking pattern having openings, with said openings corresponding to implantation regions of the crystalline silicon-based layer, amorphising the crystalline silicon-based layer through the openings of the at least one masking pattern, in the implantation regions, to a depth d strictly less than the thickness e, so as to form amorphised implantation regions in the crystalline silicon-based layer, implanting carbon into the amorphised implantation regions using the at least one masking pattern, performing thermal recrystallisation annealing to turn the amorphised implantation regions into crystalline SiC-based regions, forming through epitaxy of raised source and drain regions on the crystalline SiC-based regions, and after forming the crystalline SiC-based regions, forming a transistor gate on the silicon-based layer with a vertical edge of the transistor gate being formed directly at a vertical edge of the crystalline SiC-based regions.

* * * * *